(12) United States Patent
Andricacos et al.

(10) Patent No.: US 6,946,716 B2
(45) Date of Patent: Sep. 20, 2005

(54) ELECTROPLATED INTERCONNECTION STRUCTURES ON INTEGRATED CIRCUIT CHIPS

(75) Inventors: Panayotis Constantinou Andricacos, Croton-on-Hudson, NY (US); Harikilia Deligianni, Tenafly, NJ (US); John Owen Dukovic, Pleasantville, NY (US); Daniel C. Edelstein, New Rochelle, NY (US); Wilma Jean Horkans, Ossining, NY (US); Chao-Kun Hu, Somers, NY (US); Jeffrey Louis Hurd, Marlboro, NY (US); Kenneth P. Rodbell, Sandy Hook, NY (US); Cyprian Emeka Uzoh, Hopewell Junction, NY (US); Kwong-Hon Wong, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/773,434

(22) Filed: Feb. 9, 2004

(65) Prior Publication Data

US 2004/0229456 A1 Nov. 18, 2004

Related U.S. Application Data

(60) Division of application No. 09/348,632, filed on Jul. 6, 1999, now Pat. No. 6,709,562, which is a continuation-in-part of application No. 08/670,200, filed on Jun. 21, 1996, now abandoned.
(60) Provisional application No. 60/009,538, filed on Dec. 29, 1995.

(51) Int. Cl.[7] .............................................. H01L 29/00
(52) U.S. Cl. ..................... 257/508; 257/520; 257/750; 257/751; 257/758; 257/762; 438/678; 438/687
(58) Field of Search ................................. 257/508, 520, 257/750, 751, 752, 753, 758, 762; 438/678, 687

(56) References Cited

U.S. PATENT DOCUMENTS

| 3,328,273 A | 6/1967 | Creutz et al. |
| 3,652,442 A | 3/1972 | Powers et al. |
| 3,770,598 A | 11/1973 | Creutz |
| 4,110,176 A | 8/1978 | Creutz et al. |
| 4,339,319 A | 7/1982 | Aigo |
| 4,376,685 A | 3/1983 | Watson |
| 4,555,315 A | 11/1985 | Barbieri et al. |

(Continued)

OTHER PUBLICATIONS

F.A. Lowenheim, "Electroplating", McGraw-Hill Book Co., New York pp. 198–202, 1978.

(Continued)

*Primary Examiner*—Nathan J. Flynn
*Assistant Examiner*—Remmon R. Fordé
(74) *Attorney, Agent, or Firm*—Connolly, Bove, Lodge & Hutz, LLP; Robert M. Trepp

(57) ABSTRACT

A process is described for the fabrication of submicron interconnect structures for integrated circuit chips. Void-free and seamless conductors are obtained by electroplating Cu from baths that contain additives and are conventionally used to deposit level, bright, ductile, and low-stress Cu metal. The capability of this method to superfill features without leaving voids or seams is unique and superior to that of other deposition approaches. The electromigration resistance of structures making use of CU electroplated in this manner is superior to the electromigration resistance of AlCu structures or structures fabricated using Cu deposited by methods other than electroplating.

27 Claims, 12 Drawing Sheets

U.S. PATENT DOCUMENTS

| | | | | |
|---|---|---|---|---|
| 4,673,467 A | * | 6/1987 | Nee | 205/149 |
| 4,975,159 A | | 12/1990 | Dahms | |
| 5,256,274 A | | 10/1993 | Poris | |
| 5,266,446 A | | 11/1993 | Chang et al. | |
| 5,312,532 A | | 5/1994 | Andricacos et al. | |
| 5,391,517 A | | 2/1995 | Gelatos et al. | |
| 5,516,412 A | | 5/1996 | Andricacos et al. | |
| 5,602,423 A | | 2/1997 | Jain | |
| 5,635,423 A | | 6/1997 | Huang et al. | |
| 6,024,857 A | * | 2/2000 | Reid | 205/123 |
| 6,107,186 A | * | 8/2000 | Erb | 438/633 |
| 6,171,960 B1 | * | 1/2001 | Lee | 438/687 |
| 6,380,083 B1 | * | 4/2002 | Gross | 438/687 |

OTHER PUBLICATIONS

H. Silman et al., "Protective and Decorative Coatings for Metals", Finishing Publications Ltd., Teddington, Middlesex, England, pp. 310–314, 1978.

Bulkeley, Debra, "The First Copper–Based IC's Debut", Design News, Semiconductors, Jun. 7, 1999, pp. S–11–S14.

Andricacos, Panos C., "Copper On–Chip Interconnections. A Breakthrough in Electrodeposition to Make Better Chips", The Electrochem. Soc. Interface, Spring, 1999, pp. 32–37.

Hirano, Makato et al., Three Dimensional Passive Elements for Compact GaAs MMICs, IEICE Transactions on Electronics, vol. E76–C, No. 6, Jun. 1993, pp. 961–967.

Contolini et al, "Electrochemical Planarization for Multilevel Metallization", J. Electrochem. Soc., vol. 141, No. 9. Sep. 1994, pp 2503–2510.

* cited by examiner

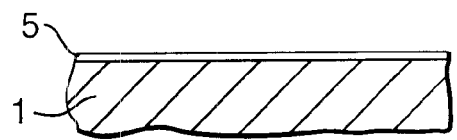
FIG. 22  FIG. 23
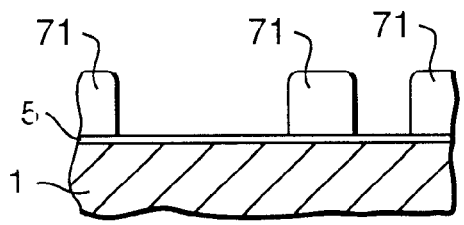
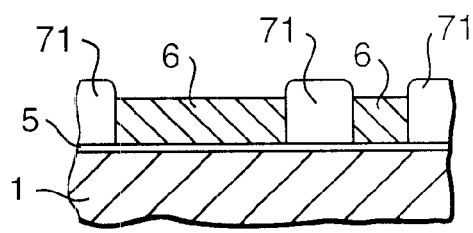
FIG. 24  FIG. 25
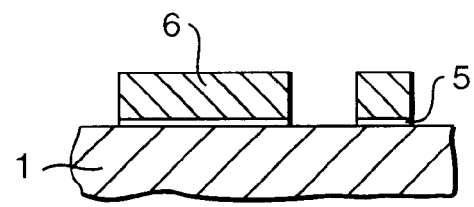
FIG. 26  FIG. 27
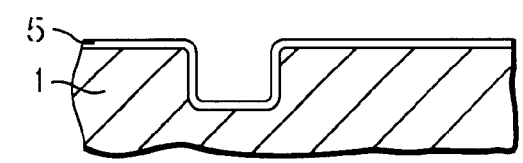
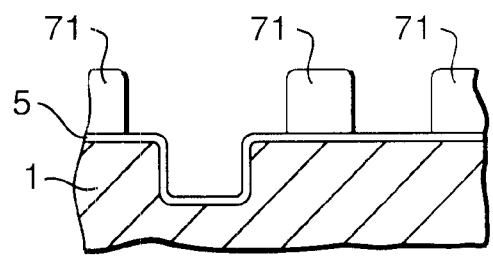
FIG. 28  FIG. 29

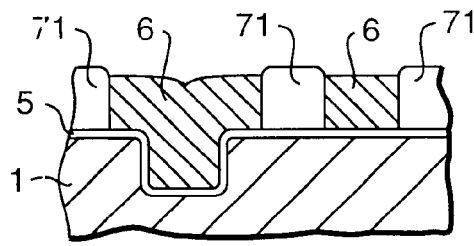
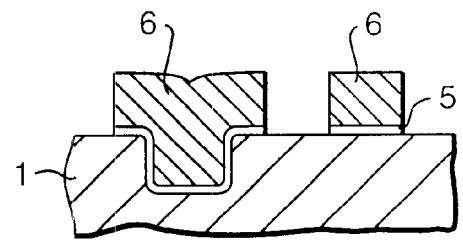
FIG. 30  FIG. 31
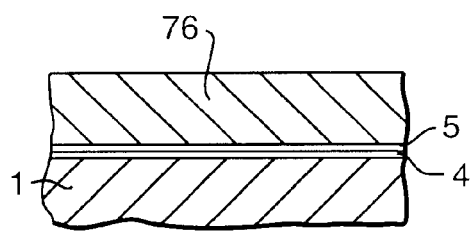
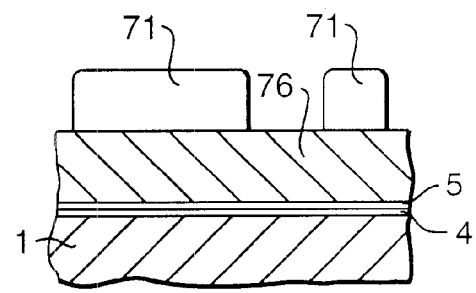
FIG. 32  FIG. 33
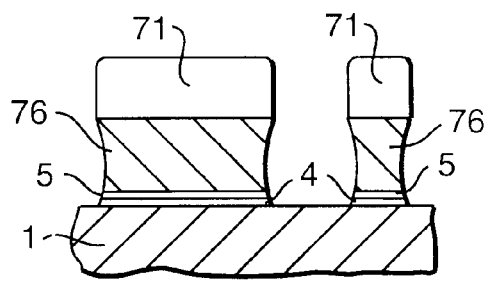
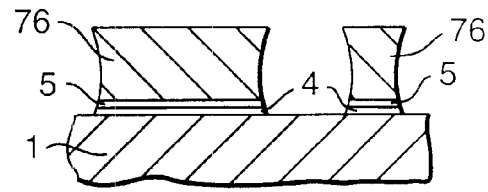
FIG. 34  FIG. 35

ELECTROPLATED INTERCONNECTION STRUCTURES ON INTEGRATED CIRCUIT CHIPS

CROSS REFERENCE TO RELATED APPLICATIONS

The present application is a division of U.S. patent application Ser. No. 09/348,632 filed Jul. 6, 1999, now U.S. Pat. No. 6,709,562 which was a continuation-in-part of U.S. patent application Ser. No. 08/670,200 filed Jun. 21, 1996, abandoned, which claimed priority from U.S. Provisional Patent Application Ser. No. 60/009,538 filed Dec. 29, 1995.

This application is cross referenced to U.S. patent application Ser. No. 08/495,249 filed Jun. 27, 1995, by P. Andricacos et al., entitled "Copper Alloys for Chip and Package Interconnections and Method of Making," which is directed to copper alloys for chip and package interconnections with about 0.01 to about 10 weight percent of carbon, indium and/or tin.

FIELD OF THE INVENTION

This invention relates to interconnection wiring on electronic devices such as on integrated circuit (IC) chips and more particularly to void-free and seamless submicron structures fabricated by Cu electroplating from baths that contain additives conventionally used to produce bright, level, low-stress deposits.

BACKGROUND OF THE INVENTION

AlCu and its related alloys are a preferred alloy for forming interconnections on electronic devices such as integrated circuit chips. The amount of Cu in AlCu is typically in the range from 0.3 to 4 percent.

Replacement of AlCu by Cu and Cu alloys as a chip interconnection material results in advantages of performance. Performance is improved because the resistivity of Cu and certain copper alloys is less than the resistivity of AlCu; thus narrower lines can be used and higher wiring densities will be realized.

The advantages of Cu metallization have been recognized by the entire semi-conductor industry. Copper metallization has been the subject of extensive research as documented by two entire issues of the Materials Research Society (MRS) Bulletin, one dedicated to academic research on this subject in MRS Bulletin, Volume XVIII, No. 6 (June 1993) and the other dedicated to industrial research in MRS Bulletin, Volume XIX, No. 8 (August 1994). A 1993 paper by Luther et al., *Planar Copper-Polyimide Back End of the Line Interconnections for ULSI Devices*, in PROC. IEEE VLSI MULTILEVEL INTERCONNECTIONS CONF., Santa Clara, Calif., Jun. 8–9, 1993, p. 15, describes the fabrication of Cu chip interconnections with four levels of metallization.

Processes such as Chemical Vapor Deposition (CVD) and electroless plating are popular methods for depositing Cu. Both methods of deposition normally produce at best conformal deposits and inevitably lead to defects (voids or seams) in wiring especially when trenches have a cross section narrower at the top than at the bottom as a result of lithographic or reactive ion etching (RIE) imperfections. Other problems of CVD have been described by Li et al., *Copper-Based Metallization in ULSI Structures—Part II: Is Cu Ahead of its Time as an On-chip Material?*, MRS BULL., XIX, 15 (1994). In electroless plating, while offering the advantage of low cost, the evolution of hydrogen during metal deposition leads to blistering and other defects that are viewed as weaknesses for industry wide implementation.

An electroplating process for depositing copper, silver or gold onto a semiconductor wafer is described in U.S. Pat. No. 5,256,274 ('274), which issued on Oct. 26, 1993, to J. Poris. In FIG. 1A of '274, a copper conductor is shown with a seam in its center with the legend "GOOD" and in FIG. 1B a copper conductor is shown with a void in its center with the legend "BAD." The plating bath contained 12 ounces/gallon of water of $CuSO_4$, $5H_2O$, 10% by volume of concentrated sulfuric acid, 50 parts per millions of chloride ion from hydrochloric acid, and TECHNI-COPPER W additive 0.4% by volume provided by Technic Inc., P.O. Box 965, Providence, R.I. 02901. Plating was selectively deposited through an inert mask.

SUMMARY OF THE INVENTION

A process is described for fabricating a low cost, highly reliable Cu interconnect structure for wiring in integrated circuit chips with void-free seamless conductors of sub-micron dimensions. The process comprises deposition of an insulating material on a wafer, lithographically defining and forming sub-micron trenches or holes in the insulating material into which the conductor will be deposited to ultimately form lines or vias, depositing a thin conductive layer serving as a seed layer or plating base, depositing the conductor by electroplating from a bath containing additives and planarizing or chemical-mechanical polishing the resulting structure to accomplish electrical isolation of individual lines and/or vias.

The invention further provides a process for fabricating an interconnect structure on an electronic device comprising the steps of forming a seed layer on a substrate having insulating regions and conductive regions, forming a patterned resist layer on the seed layer, electroplating conductor material on the seed layer not covered by the patterned resist from a bath containing additives, and removing the patterned resist.

The invention further provides a process for fabricating an interconnect structure on an electronic device with void-free seamless conductors comprising the steps of forming an insulating material on a substrate, lithographically defining and forming lines and/or vias in which interconnection conductor material will be deposited, forming a conductive layer serving as a plating base, forming a patterned resist layer on the plating base, depositing the conductor material by electroplating from a bath containing additives, and removing the resist.

The invention further provides a process for fabricating an interconnect structure on an electronic device comprising the steps of forming a seed layer on a substrate having insulating regions and conductive regions, forming a blanket layer of conductor material on the seed layer from a bath containing additives, forming a patterned resist layer on the blanket layer, removing the conductor material where not covered by the patterned resist, and removing the patterned resist. The invention further provides a conductor for use in interconnections on an electronic device comprising Cu including small amounts of a material in the Cu selected from the group consisting of C (less than 2 weight percent), O (less than 1 weight percent), N (less than 1 weight percent), S (less than 1 weight percent), and Cl (less than 1 weight percent) formed by electroplating from a bath containing additives.

The interconnection material may be Cu electroplated from baths that contain additives conventionally used to produce bright, level, low-stress deposits. The rate of Cu electroplating from such baths is higher deep within cavities than elsewhere. This plating process thus exhibits unique superfilling properties and results in void-free seamless deposits that cannot be obtained by any other method. Interconnection structures made by Cu electroplated in this manner, are highly electromigration-resistant with an activation energy for electromigration equal to or greater than 1.0 eV. The conductor is composed substantially of Cu and small amounts of atoms and/or molecular fragments of C (less than 2 weight percent), O (less than 1 weight percent), N (less than 1 weight percent), S (less than 1 weight percent), and Cl (less than 1 weight percent).

Cu which is highly electromigration-resistant is electroplated from plating solutions that contain additives conventionally used to produce bright, ductile, and low-stress plated deposits.

It is an object of the present invention to electroplate conductors of Cu such as interconnect wiring without leaving a seam or a void in the center of the conductor.

It is a further object of the present invention to electroplate conductors of Cu with substantially uniform filling thickness where the conductors have a difference in widths such as less than 1 micron and greater than 10 microns. The depth to width ratio of a conductor may be equal to or greater than 1. The depth to width ratio of a via may exceed 1.

It is a further object of the present invention to lower the manufacturing cost of integrated circuits by the combined effects of 1) blanket deposition of Cu by electrolytic plating, 2) dual damascene fabrication (an approach in which two levels of metallization are fabricated in a single blanket-deposition step), and 3) the ability to planarize the upper surface by processes such as chemical mechanical polishing.

BRIEF DESCRIPTION OF THE DRAWINGS

These and other features, objects, and advantages of the present invention will become apparent upon consideration of the following detailed description of the invention when read in conjunction with the drawing in which:

FIGS. 22–26 are cross-sectional views illustrating through-mask plating on a planar base.

FIGS. 27–31 are cross-sectional views illustrating through-mask plating on an excavated base.

FIGS. 32–35 are cross-sectional views illustrating blanket plating followed by pattern etching.

DETAILED DESCRIPTION OF THE EMBODIMENTS

Figure 5:
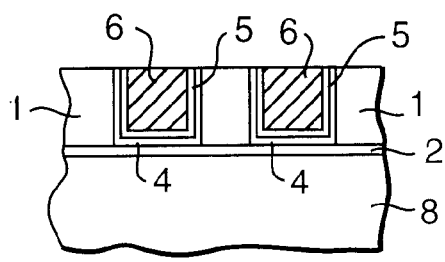
Figure 6:
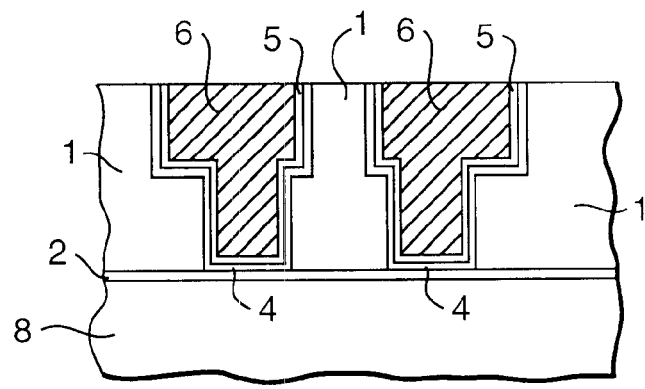
FIG. 6 shows multi-level wiring patterns formed with one plating step.

A Damascene plating process is one in which plating is done over the entire wafer surface and is followed by a planarization process that isolates and defines the features. Plating is preceded by the deposition of a plating base over the entire wiring pattern that has been defined lithographically. Layers that improve adhesion and prevent conductor/insulator interactions and diffusion are deposited between the plating base and the insulator. A schematic representation of the process is shown in FIGS. 1–5. The insulator layer (Si oxide, polymer) 1 cladded by etch/planarization layers (Si nitride) 2 and 7 is first deposited on the wafer 8; a resist pattern 3 is formed on the cladded insulator and transferred to the insulator; a barrier material 4 and a seed layer (Cu) 5 are subsequently deposited, and Cu 6 is electroplated so that all features are filled; the structure is brought to its final shape as shown in FIG. 5 by planarization. It is possible to define lithographically multiple levels of patterns onto the insulator as shown in FIG. 6; in this cost-saving fabrication method, the same sequence of layer deposition is followed.

Figure 7:
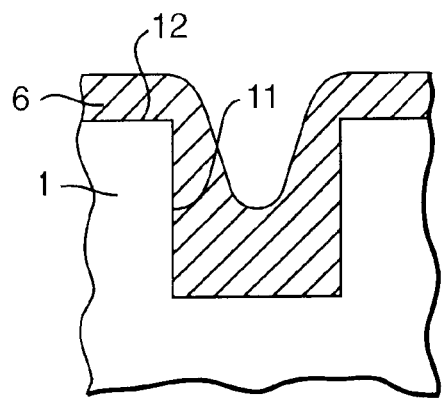
FIG. 7 illustrates early stages of deposition with the deposition rate deep within the feature being greater than the deposition rate outside of the features.
Figure 8:
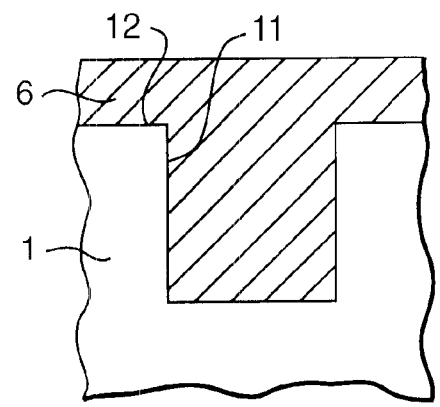
FIG. 8 shows late stages of deposition with the deposition rate inside of the features being greater than the deposition rate outside of the features.
Figure 9:
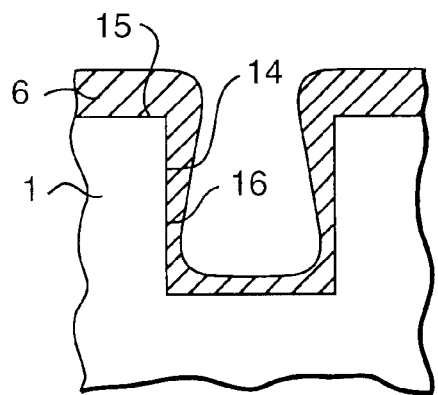
FIG. 9 illustrates early stages of deposition with the deposition rate inside of the features being slower than the deposition rate outside of the features.
Figure 10:
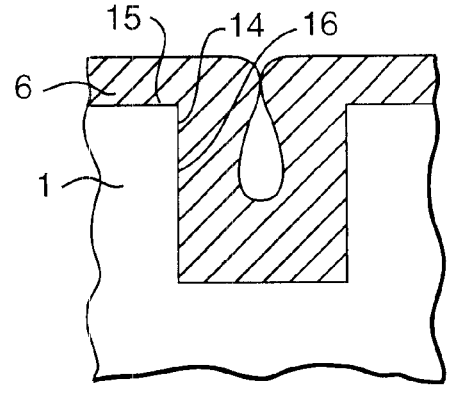
FIG. 10 shows late stages of deposition with the deposition rate inside of the features being slower than the deposition rate outside of the features.
Figure 11:
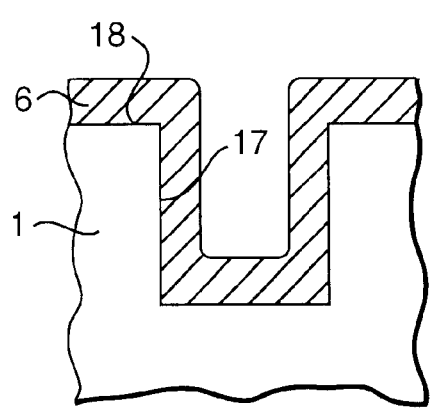
FIG. 11 illustrates early stages of deposition with the deposition rate being the same inside and outside of the features.
Figure 12:
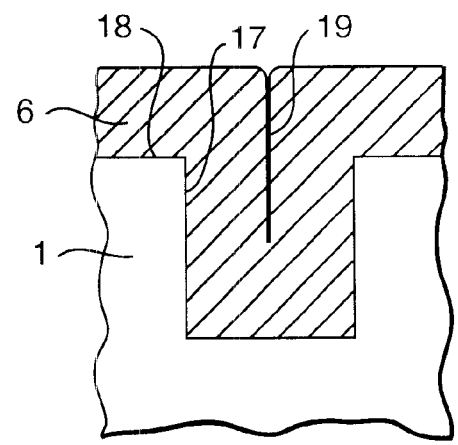
FIG. 12 shows late stages of deposition with the deposition rate being the same inside and outside of the features.

In order to avoid the formation of a void or seam in Cu 6, the rate of electroplating should be higher at low or deep points within the feature than elsewhere. This is illustrated in FIGS. 7–12 where three possible cases of metal deposition are described. In the first case shown in FIGS. 7 and 8, metal deposition within features 11 by using additives to the plating bath is faster than outside feature 11 at point 12 and results in void-free and seamless deposits (superfilling) shown in FIG. 8. The preferential deposition in the interior of features may be due to lower transport rates of additives at those locations which in turn leads to an increase in the local rate of Cu deposition. Specifically at interior corners, the rate of additive transport is lowest thus the rate of Copper deposition is highest. In the second case shown in FIGS. 9 and 10, metal deposition within features 14 is slower than outside the feature 14 at point 15 and results in voids and high-resistivity lines or vias because deposition within low points 16 of features 14 is from a bath with higher degree of depletion of the depositing ion. The higher degree of ion depletion gives rise to a locally elevated overpotential in the plating bath for the deposition reaction. In the third case shown in FIGS. 11 and 12, deposition rates everywhere, inside feature 17 and outside feature 17 at point 18, are equal (conformal filling) because there is no local ion depletion in the liquid plating bath and because the additives and their beneficial effects (preferential deposition in interior features) are missing. Although nearly acceptable deposits can be obtained by conformal filling, a seam 19 in Cu metal 6 is inevitable in lines and vias with a high aspect ratio. In a reentrant profile, conformed filling is not forgiving and will result in a void. It is evident that plating with superfilling as shown in FIGS. 7 and 8 is the required and preferred method for Damascene processing. Electrolytic plating from appropriately formulated solutions is one of the best ways to accomplish the type of deposition shown in FIGS. 7 and 8. Superfilling and its relevance to Cu metallization is totally unknown; for example, in the publication by Li et al. cited above, Li et al. stated that the via filling capability of electrolytic Cu plating is "fair-poor."

Figure 13:
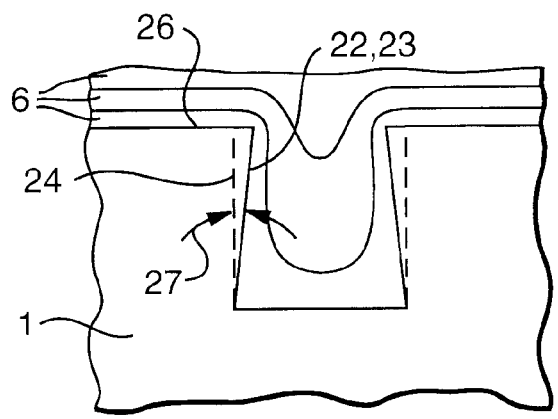
FIG. 13 shows a cross-sectional view of a sequence of plating profiles.

Superfilling by the use of additives in the plating bath makes it possible to create void-free and seamless lines and vias even if the lithographic process produces features or cavities 22 in a dielectric layer 1 that are narrower at the top than at the bottom as shown in FIG. 13. Electroplating according to the invention herein is one of the best ways by which void-free and seamless lines and vias can be accomplished. Other methods of deposition such as CVD which at best generate conformal profiles inevitably lead to gross defects especially when lithographic imperfections of this kind are present i.e., features or cavities 22 in a dielectric 1 that are narrower at the top than at the bottom such that sidewall 23 may form an angle with a vertical reference line 24 with respect to the top surface 26 in the range from 0 to 20° as shown by arrow 27.

Copper plating from solutions incorporating additives conventionally used to produce level deposits on a rough surface can be used to accomplish superfilling required to fill sub-micron cavities. One suitable system of additives is the one marketed by Enthone-OMI, Inc., of New Haven, Conn. and is known as the SelRex Cubath M system. The above additives are referred to by the manufacturer as MHy. Another suitable system of additives is the one marketed by LeaRonal, Inc., of Freeport, N.Y., and is known as the Copper Gleam 2001 system. The additives are referred to by the manufacturer as Copper Gleam 2001 Carrier, Copper Gleam 2001-HTL, and Copper Gleam 2001 Leveller. And another suitable system of additives is the one marketed by Atotech USA, Inc., of State Park, Pa., and is known as the Cupracid HS system. The additives in this system are referred to by the manufacturer as Cupracid Brightener and Cupracid HS Basic Leveller.

Examples of specific additives which may be added to a bath in the instant invention are described in several patents.

U.S. Pat. No. 4,110,176, which issued on Aug. 29, 1978, to H-G Creutz deceased et al., entitled "Electrodeposition of Copper" described the use of additives to a plating bath such as poly alkanol quaternary-ammonium salt which formed as a reaction product to give bright, highly ductile, low stress and good leveling copper deposits from an aqueous acidic copper plating bath which patent is incorporated herein by reference.

U.S. Pat. No. 4,376,685, which issued on Mar. 15, 1983, to A. Watson, entitled "Acid Copper Electroplating Baths Containing Brightening and Leveling Additives," described additives to a plating bath such as alkylated polyalkyleneimine which formed as a reaction product to provide bright and leveled copper electrodeposits from an aqueous acidic bath which patent is incorporated herein by reference.

U.S. Pat. No. 4,975,159, which issued on Dec. 4, 1990, to W. Dahms, entitled "Aqueous Acidic Bath for Electrochemical Deposition of a Shiny and Tear-free Copper Coating and Method of Using Same," described adding to an aqueous acidic bath combinations of organic additives including at least one substituted alkoxylated lactam as an amide-group-containing compound in an amount to optimize the brightness and ductility of the deposited copper, which patent is incorporated herein by reference. In U.S. Pat. No. 4,975,159, Table I lists a number of alkoxylated lactams which may be added to a bath in the instant invention. Table II lists a number of sulfur-containing compounds with water-solubilizing groups such as 3-mercaptopropane-1-sulfonic acid which may be added to a bath in the instant invention. Table III lists organic compounds such as polyethylene glycol which may be added to a bath as surfactants in the instant invention.

U.S. Pat. No. 3,770,598, which issued on Nov. 6, 1973, to H-G Creutz, entitled "Electrodeposition of Copper from Acid Baths," describes baths for obtaining ductile, lustrous copper containing therein dissolved a brightening amount of the reaction product of polyethylene imine and an alkylating agent to produce a quaternary nitrogen, organic sulfides carrying at least one sulfonic group, and a polyether compound such as polypropylene glycol, which patent is incorporated herein by reference.

U.S. Pat. No. 3,328,273, which issued on Jun. 27, 1967, to H-G Creutz et al., entitled "Electrodeposition of Copper from Acidic Baths," describes copper sulfate and fluoborate baths for obtaining bright, low-stress deposits with good leveling properties that contain organic sulfide compounds of the formula $XR_1—(S_n)—R_2—SO_3H$, where $R_1$ and $R_2$ are the same or different and are polymethylene groups or alkyne groups containing 1–6 carbon atoms, X is hydrogen or a sulfonic group, and n is an integer of 2–5 inclusive, which patent is incorporated herein by reference. Additionally these baths may contain polyether compounds, organic sulfides with vicinal sulphur atoms, and phenazine dyes. In U.S. Pat. No. 3,328,273, Table I lists a number of polysulfide compounds which may be added to a bath in the instant invention. Table II lists a number of polyethers which may be added to a bath in the instant invention.

Additives may be added to the bath for accomplishing various objectives. The bath may include a copper salt and a mineral acid. Additives may be included for inducing in the conductor specific film microstructures including large grain size relative to film thickness or randomly oriented grains. Also, additives may be added to the bath for incorporating in the conductor material molecular fragments containing atoms selected from the group consisting of C, O, N, S and Cl whereby the electromigration resistance is enhanced over pure Cu. Furthermore, additives may be added to the bath for inducing in the conductor specific film microstructures including large grain size relative to film thickness or randomly oriented grains, whereby the electromigration behavior is enhanced over non-electroplated Cu.

Figure 14:
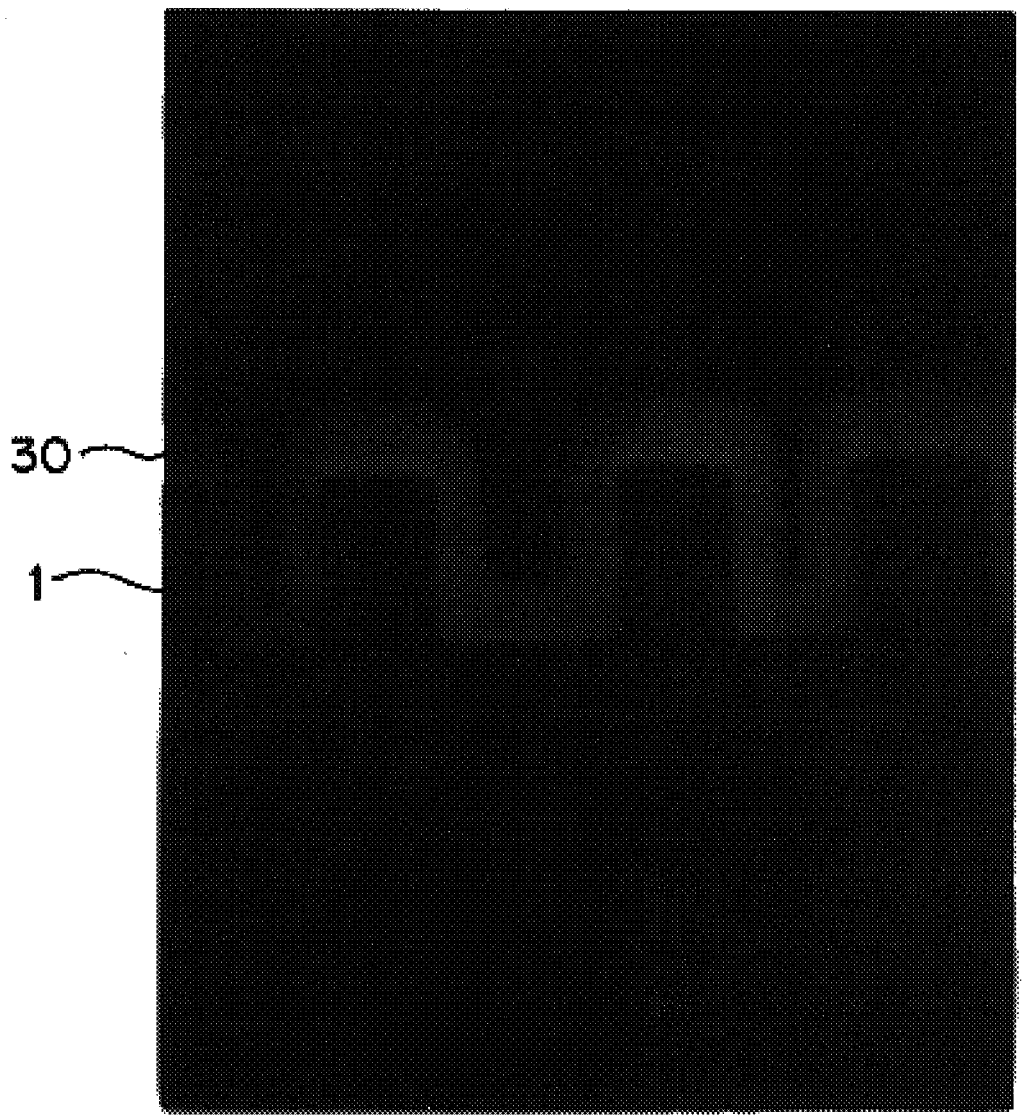
FIG. 14 shows a cross-sectional view of a feature plated electrolytically using a plating bath without additives.
Figure 15:
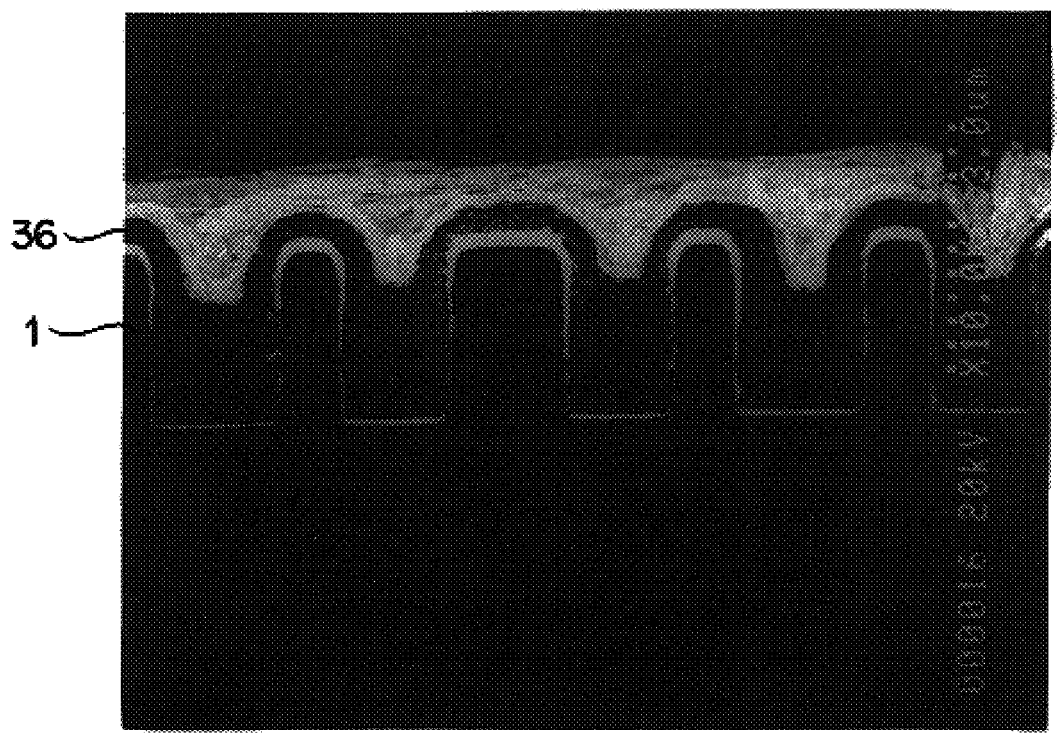
FIG. 15 shows a cross-sectional view of a feature plated electrolytically using a plating bath with additives.
Figures 19A, 19B:
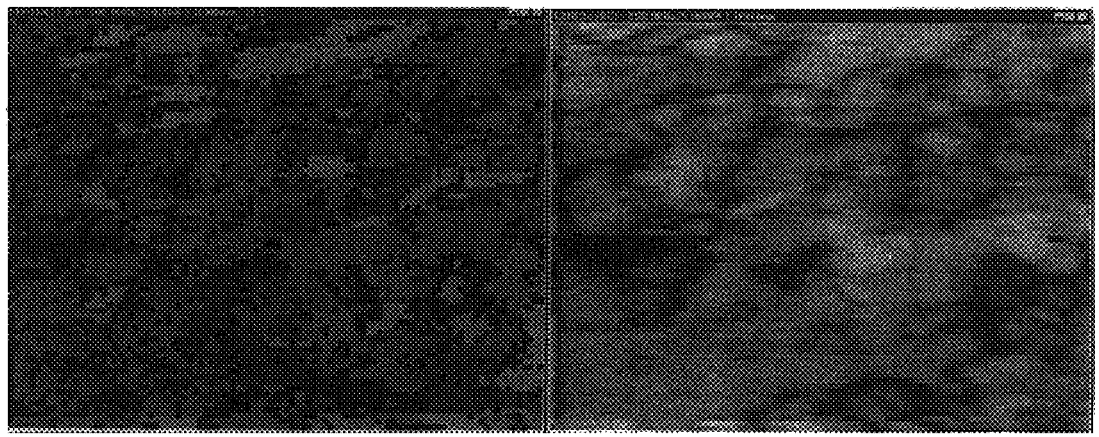
FIGS. 19a–d are a grain orientation map, grain contrast map, inverse pole figure and (111) pole figure of the same region for a 1 micron thick plated Cu film. The grain size is approximately 1.4 microns and the crystallographic texture is random.
Figure 19C:
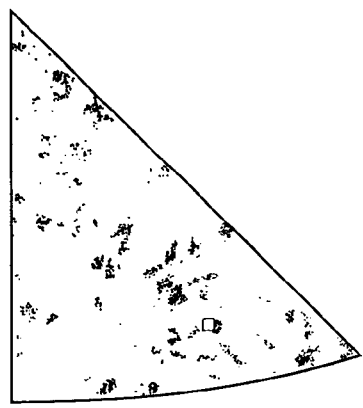
Figure 19D:
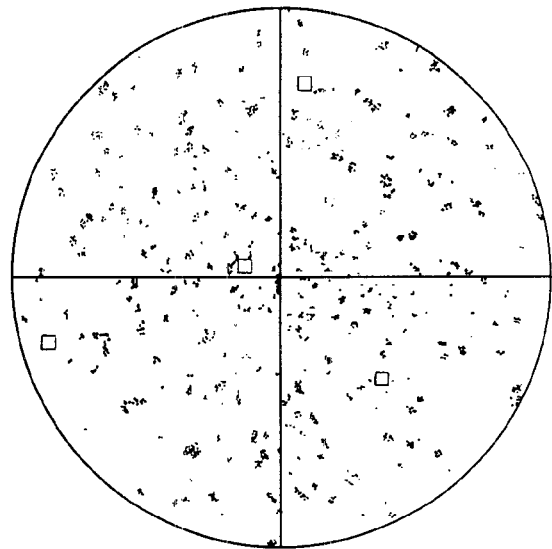
Figure 20C:
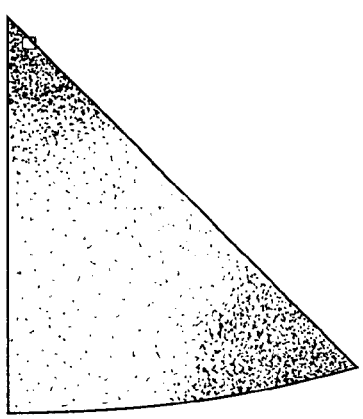
FIGS. 20a–d are a grain orientation map, grain contrast map, inverse pole figure and (111) pole figure of the same region for a 1 micron thick PVD (physical vapor deposition, magnetron sputter deposited) Cu film. The grain size is approximately 0.4 microns and this film has a strong (111)/(100) crystallographic texture.
Figure 20D:
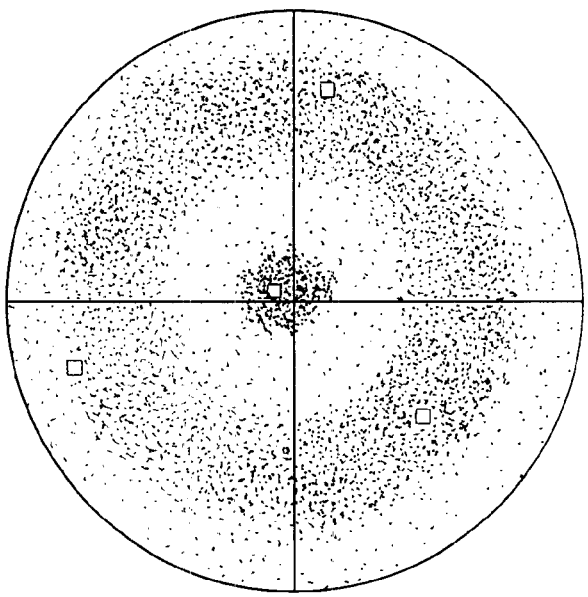
Figures 20A, 20B:
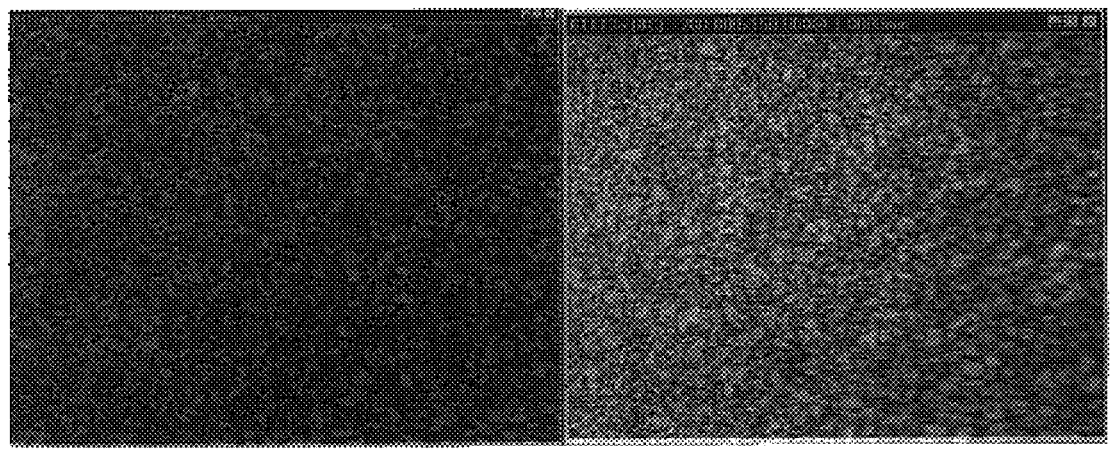

FIG. 14 shows a cross-sectional view of the cavity-filling behavior of a plating solution containing 0.3 M cupric sulfate and 10% by volume sulfuric acid of the prior art. Plating has been interrupted before complete cavity filling to measure deposit thickness at various locations of the feature thus determining the type of filling. It is seen that conformal deposits of Cu 30 are obtained. However, a deposit obtained by the same solution to which chloride ion and MHy additive have been added, exhibits superfilling as shown in FIG. 15. The deposition rate deep within the feature is higher than elsewhere, and finally the deposit of Cu 36 shown in FIG. 15 will be void-free and seamless due to higher plating rates inside the feature than outside the feature. MHy concentrations that produce superfilling are in the range from about 0.1 to about 2.5 percent by volume. Chloride ion concentrations are in the range from 10 to 300 ppm.

Similar superfilling results are obtained from a solution containing cupric sulfate in the rate from 0.1 to 0.4M, sulfuric acid in the range from 10 to 20% by volume, chloride in the range from 10 to 300 ppm, and LeaRonal additives Copper Gleam 2001 Carrier in the range from 0.1 to 1% by volume, Copper Gleam 2001-HTL in the range from 0.1 to 1% by volume, and Copper Gleam 2001 Leveller in the range 0 to 1% by volume. Finally, similar superfilling results are obtained from a solution containing cupric sulfate, sulfuric acid, and chloride in the ranges mentioned above and Atotech additives Cupracid Brightener in the range from 0.5 to 3% by volume and Cupracid HS Basic Leveller in the range from 0.01 to 0.5% by volume.

The plating processes described thus far with additives produce superfilling of submicron, high-aspect-ratio features or cavities when performed in conventional plating cells, such as paddle plating cells described in U.S. Pat. Nos. 5,516,412, 5,312,532, which issued on May 17, 1994 to P. Andricacos et al., and U.S. Pat. No. 3,652,442. However, a further benefit described below is realized when the process is performed in a plating cell in which the substrate surface is held in contact only with the free surface of the electrolyte, for example a cup plating cell described in U.S. Pat. No. 4,339,319, which issued Jul. 13, 1982, to S. Aigo, which is incorporated herein by reference. The benefit here is the superfilling of wide cavities in the range from 1 to 100 microns, which may be present among the narrow (submicron) features or cavities.

In a plating cell in which the substrate is submerged in the electrolyte, wide features in the range from 1 to 100 microns will fill more slowly than do narrow features having a width less than 1 micron, such as about 0.1 and above; hence wide features necessitate both a longer plating time and a longer polishing time to produce a planarized structure with no dimples or depressions on the top plated surface.

In contrast in a cup plating cell, when the substrate surface to be plated is held in contact with the meniscus of the electrolyte during plating, cavities of greatly different widths such as less than 1 micron and greater than 10 microns are filled rapidly and evenly at the same rate.

The meniscus of the electrolyte is the curved upper surface of a column of liquid. The curved upper surface may be convex such as from capillarity or due to liquid flow such as from an upwelling liquid.

Figure 16:
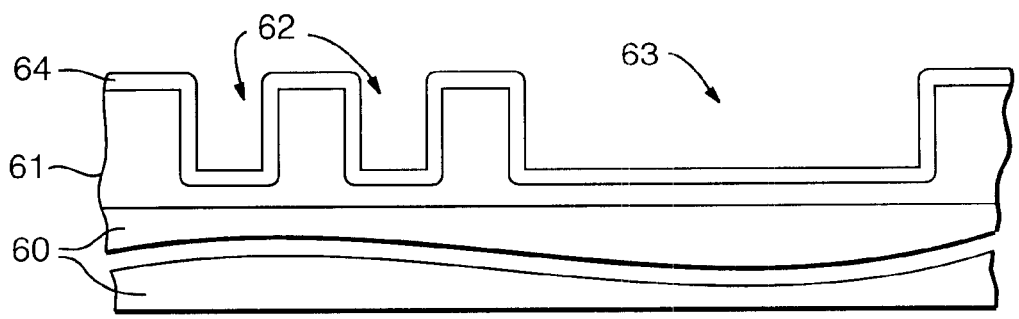
FIG. 16 is a cross-sectional view of a substrate having both submicron and wide cavities to be plated.

FIG. 16 is a cross-sectional view of a substrate 60 which may have an upper layer of dielectric 61 such as silicon dioxide having surface features or cavities 62 and 63 formed therein for damascene wiring. Cavities 62 may have a width less than one micron and cavity 63 may have a width in the range from 1 to 100 microns. A liner 64 may provide adhesion to dielectric 61 and provide a diffusion barrier to metals subsequently plated. Liner 64 may be conductive to act as a plating base for electroplating or an additional plating base layer may be added.

Figure 17:
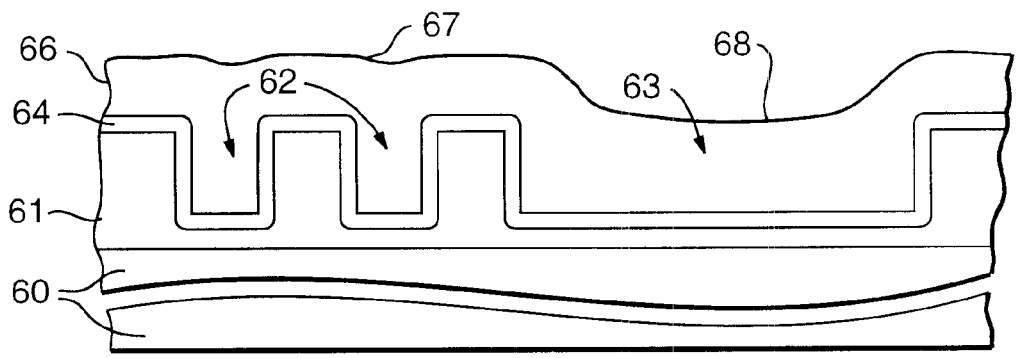
FIG. 17 is a cross-sectional view of the substrate of FIG. 16 which has been subsequently plated in a wafer immersion-type plating cell.

FIG. 17 is a cross-sectional view of substrate 60 having an electrodeposit of metal 66 sufficient to fill cavities 62 and to fill the wide cavity 63 which was plated in an immersion-type cell. In FIG. 17, wide feature 63 fills slower than narrow or submicron features 62. The upper surface 67 has a dip 68 over feature 63 with respect to the average height of metal 66.

Figure 18:
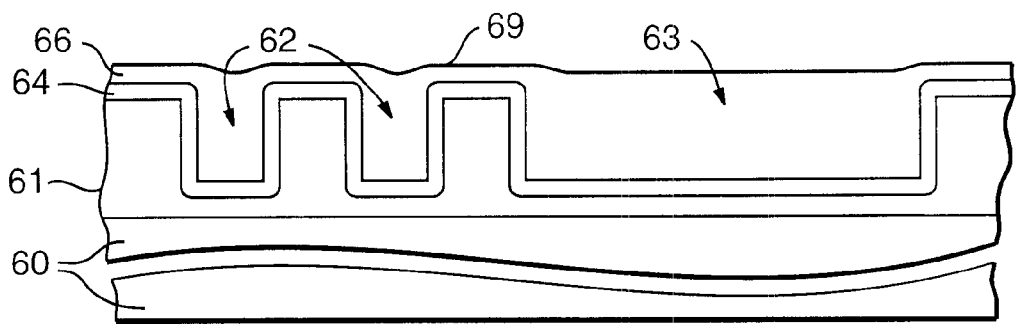
FIG. 18 is a cross-sectional view of the substrate of FIG. 16 which has been subsequently plated in a meniscus-type plating cell (cup plater) where the wafer surface is brought into contact with the upper surface or meniscus of the electrolyte.

In FIGS. 17 and 18, like references are used for functions corresponding to the apparatus of FIGS. 16 and 17.

FIG. 18 is a cross-sectional view of substrate 60 having an electrodeposit of metal 66 which may be Cu sufficient to fill cavities 62 and to fill wide cavity 63 which was plated in a meniscus-type cup plating cell. As shown in FIG. 18, the substrate may be placed in contact with the surface of the bath. The bath may be flowed at the surface of the bath.

In FIG. 18, wide feature 63 fills as fast as narrow features 62. The upper surface 69 has a very little dip over feature 63 with respect to the average height of metal 66. Accordingly, we describe a mode of the invention in which the plating is done in a cup plater to achieve even superfilling of narrow and wide features. It is believed that the superior performance of meniscus plating is due to the higher concentration and perhaps different orientation of the surface-active additive molecules at the air-liquid surface. Though these molecules may begin to redistribute when the substrate is introduced, residual effects probably persist throughout the plating period, several minutes in duration.

The electroplated Cu metal 66 shown in FIGS. 16 and 17 consists substantially of Cu and may also contain small amounts of atoms and/or molecular fragments of C (less than 2 weight percent), with O (less than 1 weight percent), N (less than 1 weight percent), S (less than 1 weight percent), or Cl (less than 1 weight percent). These additional components apparently originate from the decomposition of additives and are subsequently incorporated in the deposit 66 in the probable form of molecular fragments rather than atoms. Chlorine is co-absorbed due to its synergistic role in activating additive action. As a result, it is believed that these inclusions reside in the grain boundaries and in so doing, they do not affect the resistivity of the plated metal. Indeed, measurements of the resistivity of the plated Cu yield values lower than 2 $\mu\Omega$cm. It is also believed that the same molecules by virtue of the fact that they reside at grain boundaries of Cu render the electromigration resistance of electroplated Cu much better than that of pure Cu that has been deposited by other processes.

The grain size of electroplated Cu is generally larger than that produced by other Cu deposition techniques (see FIGS. 19a–d and 20a–d). FIGS. 19a–d are, respectively, a grain orientation map, grain contrast map, inverse pole figure and (111) pole figure of the same region for a 1 micron thick plated Cu film. The grain size is approximately 1.4 microns and the crystallographic texture is random. FIGS. 20a–d are, respectively, a grain orientation map, grain contrast map, inverse pole figure and (111) pole figure of the same region for a 1 micron thick PVD Cu film. The grain size is approximately 0.4 microns and this film has a strong (111)/(100) crystallographic texture.

The crystallographic orientation (also known as texture) of plated Cu is substantially more random than that of non-plated Cu films (see FIGS. 19a–d and 20a–d). This random orientation is indicated by the uniform distribution of grains in the inverse pole figure or the (111) pole figure (see FIGS. 19a–d). This is substantially different from that seen for non-plated Cu films. For example, see FIGS. 20a–d, where there is substantial (100) and (111) texture in this PVD Cu film.

Figure 21A:
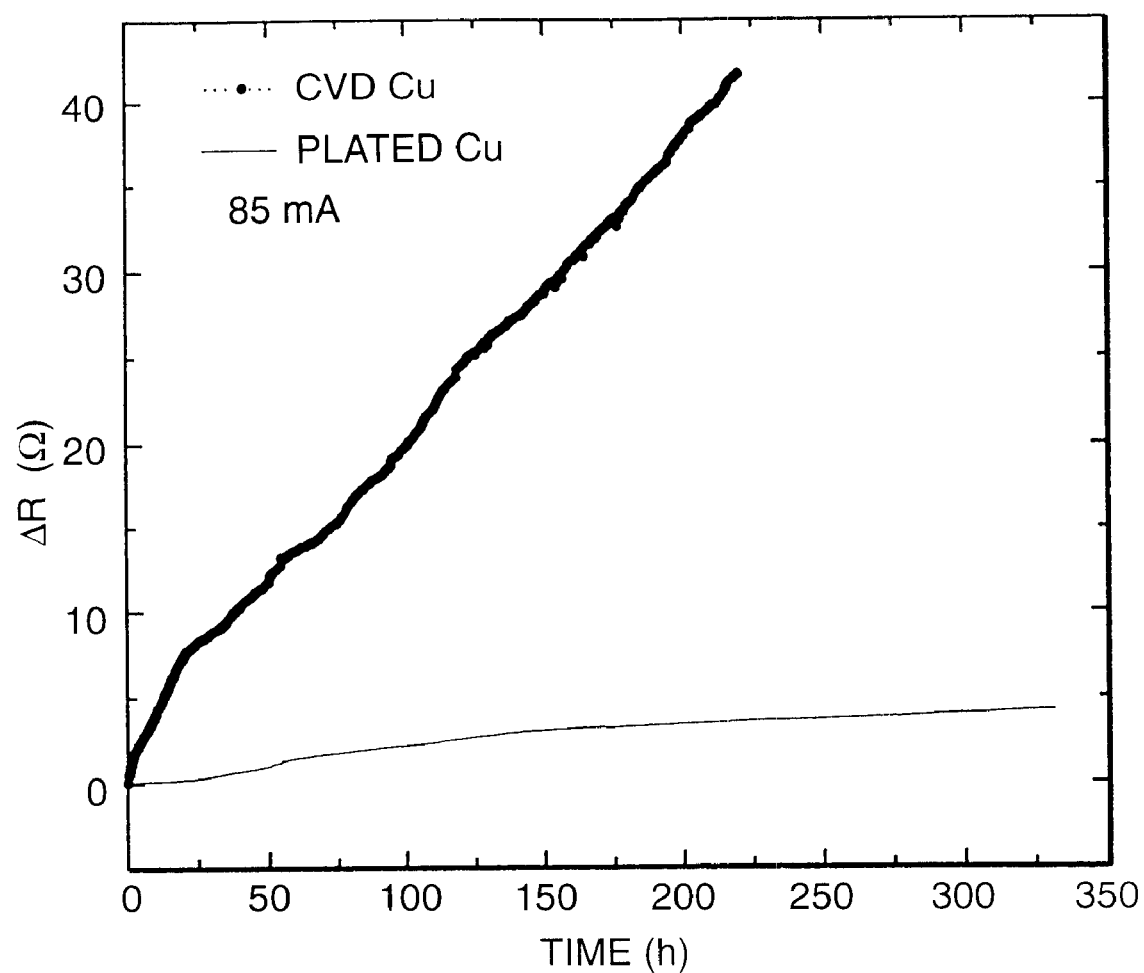
FIGS. 21a and 21b show the change in resistance versus time (hours) for plated Cu versus a) CVD Cu and b) PVC Cu films. The change in resistance is related to the amount of electromigration damage in the Cu line. Clearly plated Cu has a much improved electromigration behavior than either CVD or PVD Cu. The activation energy for plated Cu is 1.1–1.3 eV while that for PVD Cu is considerably less (0.7–0.8 eV).
Figure 21B:
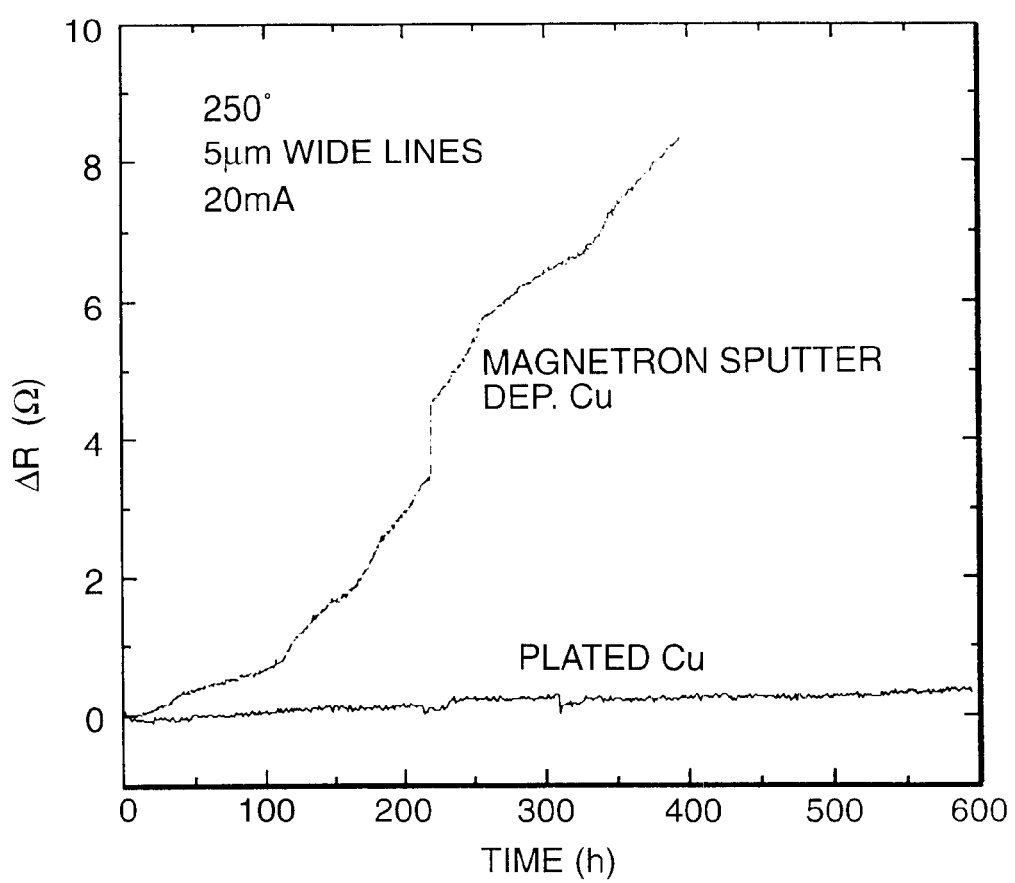

The electromigration resistance of electroplated Cu and pure Cu is a function of the activation energy as measured by the methods referred to in MRS Bulletin, Volume XVIII, No. 6 (June 1993), and Volume XIX, No. 8 (August 1994), which are incorporated herein by reference. The activation energy of electroplated Cu is equal to or greater than 1.0 eV. In addition, FIGS. 21a and 21b show a comparison of the drift velocity of plated versus a PVD film. Clearly, the plated Cu shows little change in resistance over time whereas the PVD Cu film resistance increases dramatically. The change in resistance is related to the amount of electromigration damage in the Cu line. Clearly plated Cu has a much improved electromigration behavior than does PVC Cu. The activation energy for plated Cu is 1.1–1.3 eV while that for PVD Cu is considerably less (0.7–0.8 eV).

The value of the present invention extends beyond implementation in damascene structures. The increased resistance to electromigration, associated with the presence of atoms and/or molecular fragments containing C, O, N, S, and Cl, is similarly beneficial in conductor elements that are fabricated by through-mask plating on a planar base as shown in FIGS. 22–26, by through-mask plating on an excavated base as shown in FIGS. 22 and 27–31, or by blanket plating followed by patterned etching as shown in FIGS. 22, 23 and 32–35.

The process for through-mask plating on a planar base is shown in FIGS. 22–26. FIG. 22 shows an insulating layer 1. FIG. 23 shows a seed layer (Cu) 5 formed over insulating layer 1. A barrier material 4 (not shown) may be placed as a layer between insulating layer 1 and seed layer 5. FIG. 24 shows resist 71 which has been patterned over seed layer 5. FIG. 25 shows Cu 6 after electroplating through resist 71. FIG. 26 shows the structure of FIG. 25 with resist 71 removed and with seed layer 5 removed where not protected by Cu 6. FIG. 26 shows a patterned layer of Cu 6 over the patterned seed layer 5.

The process for through-mask plating on an excavated base is shown in FIGS. 22 and 27–31. FIG. 22 shows an insulating layer 1. FIG. 27 shows a channel 72 formed in insulating layer 1. FIG. 28 shows a seed layer (Cu) 5 formed over insulating layer 1. A barrier material 4 (not shown) may be formed underneath seed layer (Cu) 5. FIG. 29 shows resist 71 which has been patterned over seed layer 5. FIG. 30 shows Cu 6 in channel 72 and over seed layer 5 which was deposited by plating through mask or resist 71. FIG. 31 shows Cu 6 with resist 71 removed and with seed layer 5 removed where not protected by Cu 6. It is noted that the superfilling attribute of the plating process of this invention makes it possible to fill cavities or features in the excavated base without remnant voids or seams.

The process for blanket plating followed by pattern etching is shown in FIGS. 22, 23 and 32–35 for forming patterned lines on an insulating layer. FIG. 22 shows an insulating layer 1. FIG. 23 shows a barrier layer 4 formed over insulating layer 1. A seed layer (Cu) 5 is formed on the upper surface of barrier layer 4. A blanket layer 76 of Cu is formed as shown in FIG. 32 by electroplating over seed layer 5. A layer of resist 71 is formed over blanket layer 76 and lithographically patterned as shown in FIG. 33. FIG. 34 shows blanket layer 76 patterned by etching or removing by other processes where not protected by resist 71. FIG. 35 shows the patterned blanket layer 76 with resist 71 removed.

Figure 1:
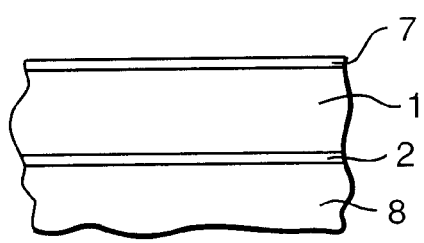
FIGS. 1–5 are cross-sectional views of intermediate structures illustrating the formation of interconnection wiring.
Figure 2:
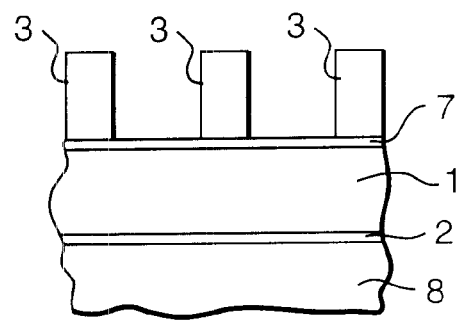
Figure 3:
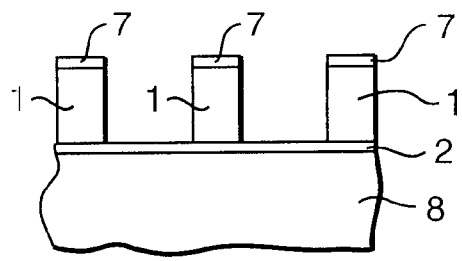
Figure 4:
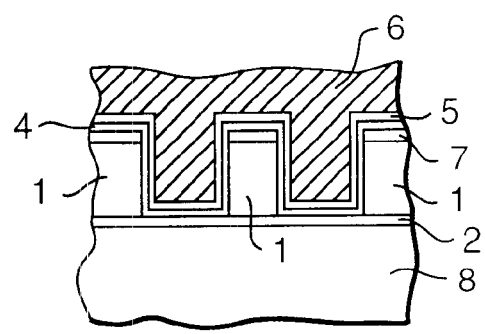

In FIGS. 2–15 and 22–35, like references are used for functions corresponding to the apparatus of an earlier Figure or of FIG. 1.

While there has been described and illustrated a process for fabricating an interconnect structure on an electronic device and a Cu conductor having electromigration resistance due to atoms and/or molecular fragments of C, O, N, S, and Cl, and specific microstructural features such as large grains size relative to film thickness and a random crystallographic orientation, it will be apparent to those skilled in the art that modifications and variations are possible without deviating from the broad scope of the invention which shall be limited solely by the scope of the claims appended hereto.

What we claim is:

1. A structure for use in interconnections on an electronic device comprising:

a dielectric layer having a substantially planar upper surface and having a pattern of recesses therein, the recesses having a width at the upper surface less than one micrometer, the recesses filled with continuous electroplated metal from a bath containing additives, wherein the additives cause the plating rate to increase with depth along the sidewalls of a recess and avoid seam and/or void formation in the recesses; and wherein the conductor material comprises copper.

2. The structure of claim 1 wherein the recesses have a depth to width ratio equal to or greater than 1.

3. The structure of claim 1 wherein the recesses have a conductive layer on the recesses on said dielectric layer to serve as a plating base.

4. The structure of claim 1 further including a metal liner between the conductive layer and the dielectric layer in the recesses.

5. The structure of claim 1 wherein the copper includes small amounts of a material in said copper selected from the group consisting of C (less than 2 weight percent), O (less than 1 weight percent), N (less than 1 weight percent), S (less than 1 weight percent), and Cl (less than 1 weight percent).

6. The structure of claim 1 wherein the copper includes specific film microstructures including large grain size relative to film thickness and/or randomly oriented grains.

7. The structure of claim 5 wherein the small amounts of material include atoms and/or molecular fragments.

8. The structure of claim 1 wherein the conductor has an activation energy for electromigration equal to or greater than 1.0 eV and further includes specific film microstructures including large grain size relative to film thickness and/or randomly oriented grains whereby the electromigration behavior is enhanced over non-electroplated copper.

9. The structure of claim 1 wherein the conductor material further includes positive amounts of atoms and/or molecular fragments containing atoms selected from the group consisting of C, O, N, S, and Cl.

10. The structure of claim 9 wherein the electromigration resistance of the copper is enhanced over pure copper.

11. The structure of claim 1 wherein the copper is obtained by electroplating from a plating solution comprising a copper salt, a mineral acid, and one or more additives selected from the group consisting of an organic sulfur compound with water solubilizing groups, a bath-soluble oxygen-containing compound, a bath-soluble polyether compound, or a bath-soluble organic nitrogen compound that may also contain at least one sulfur atom.

12. The structure of claim 11 wherein the plating solution contains small amounts of a chloride ion in the range from 10 to 300 parts per million.

13. The structure of claim 11 wherein the copper salt is cupric sulfate.

14. The structure of claim 11 wherein the mineral acid is sulfuric acid.

15. The structure of claim 11 wherein the organic sulfur compound carries at least one sulfonic group.

16. The structure of claim 11 wherein the organic sulfur compound has at least two sulfur atoms that are vicinal.

17. The structure of claim 16 wherein the organic sulfur compound has at least two sulfur atoms that are vicinal and carries at least one terminal sulfonic group.

18. The structure of claim 11 wherein the organic sulfur compound is selected from the group consisting of mercaptopropane sulfonic acid, thioglycolic acid, mercaptobenzthiozol-S-propansulfonic acid and ethylene-dithiodipropyl sulfonic acid, dithiocarbamic acid, alkali metal salts thereof, and amine salts thereof.

19. The structure of claim 11 wherein the organic sulfur compound has the formula $X—R_1—(S_n)—R_2—SO_3H$ where the R groups are the same or different and contain at least one carbon atom, X is selected from the group consisting of a hydrogen and a sulfonic group, and n is 2–5 inclusive.

20. The structure of claim 11 wherein the oxygen-containing compound is selected from the group consisting of polyethylene glycol, and carboxymethylcellulose.

21. The structure claim 11 wherein said organic nitrogen compound is selected from the group containing pyridines and substituted pyridines, amides, quaternary ammonium salts, imines, phthalocyanines and substituted phthalocyanines, phenazines, and lactams.

22. The structure of claim 11 which comprises a double damascene structure.

23. The structure of claim 1 wherein the additives are polarizing.

24. The structure of claim 1 wherein each of the recesses has a bottom surface and side surfaces intersecting the bottom surface, and wherein the conductor material is deposited on the bottom surface and side surfaces.

25. The structure of claim 24 wherein the bottom surface of each recess is substantially horizontal with respect to a major plane of the substrate.

26. The structure of claim 1 wherein the additives comprise agents for producing bright, level deposits on rough surfaces.

27. The structure claim 1 wherein the additives comprise agents for depositing bright, level, ductile, and low-stress deposits.

* * * * *

UNITED STATES PATENT AND TRADEMARK OFFICE
CERTIFICATE OF CORRECTION

PATENT NO.        : 6,946,716 B2                                          Page 1 of 1
APPLICATION NO. : 10/773434
DATED             : September 20, 2005
INVENTOR(S)       : Panayotis Constantinou Andricacos et al.

It is certified that error appears in the above-identified patent and that said Letters Patent is hereby corrected as shown below:

In column 10, line 34, the last line of claim 1, replace the words "conductor material" with the word "metal".

In column 10, line 54, the first line of claim 8, replace the word "conductor" with the word "metal".

In column 10, line 60, the first line of claim 9, replace the words "conductor material" with the word "metal".

In column 12, line 16, the third line of claim 24, replace the words "conductor material" with the word "metal".

Signed and Sealed this

Thirtieth Day of November, 2010

David J. Kappos
*Director of the United States Patent and Trademark Office*